United States Patent [19]
Mera et al.

[11] Patent Number: 5,753,923
[45] Date of Patent: May 19, 1998

[54] ION INJECTION DEVICE AND METHOD THEREFOR

[75] Inventors: Kazuo Mera; Isao Hashimoto, both of Hitachi; Yasuo Yamashita, Mito; Minoru Fujimoto; Kouji Ishiguro, both of Hitachi, all of Japan

[73] Assignee: Hitachi, Ltd., Tokyo, Japan

[21] Appl. No.: 654,601

[22] Filed: May 29, 1996

[30] Foreign Application Priority Data

May 29, 1995 [JP] Japan ................ 7-130705

[51] Int. Cl.$^6$ ........................... H01J 37/317
[52] U.S. Cl. ................ 250/443.1; 252/442.11; 252/492.21
[58] Field of Search .......... 250/440.11, 441.11, 250/442.11, 443.1, 492.2, 492.21

[56] References Cited

U.S. PATENT DOCUMENTS

| | | | |
|---|---|---|---|
| 3,993,018 | 11/1976 | Kranik et al. | 250/440.11 |
| 4,453,080 | 6/1984 | Berkowitz | 250/442.11 |
| 4,705,951 | 11/1987 | Layman et al. | 250/442.11 |
| 4,733,087 | 3/1988 | Narita et al. | 250/442.11 |
| 4,745,287 | 5/1988 | Turner | 250/442.11 |
| 4,817,556 | 4/1989 | Mears et al. | 250/442.11 |
| 5,126,571 | 6/1992 | Sakai | 250/443.1 |
| 5,180,918 | 1/1993 | Isobe | 250/492.2 |
| 5,218,209 | 6/1993 | Taskeyama | 250/440.11 |
| 5,357,115 | 10/1994 | Asakawa et al. | 250/492.21 |
| 5,393,984 | 2/1995 | Glavish | 250/492.21 |
| 5,478,195 | 12/1995 | Usami | 250/441.11 |

*Primary Examiner*—Bruce Anderson
*Attorney, Agent, or Firm*—Antonelli, Terry, Stout, & Kraus, LLP

[57] ABSTRACT

An ion injection device is provided which permits ion injection into a wafer with an optimum ion beam injection angle, and the ion injection device is characterized, by the provision of a wafer holding means for holding a wafer into which ion beam taken out from an ion source is implanted; a relative position varying means for varying the relative position between the wafer holding means and the ion beam within a plane substantially perpendicular to the direction of the ion beam; and an incidence angle varying means for varying an incidence angle of the ion beam on the surface of the wafer held on the wafer holding means. More specifically, the wafer holding means is a rotatable disk which holds a plurality of wafers on the circumference thereof, and the relative position varying means is constituted by a rotating means which causes the rotatable disk to rotate in a plane substantially perpendicular to the direction of the ion beam and by a rocking means for rocking the rotatable disk in a plane substantially perpendicular to the direction of the ion beam.

14 Claims, 11 Drawing Sheets

ION INJECTION DEVICE AND METHOD THEREFOR

BACKGROUND OF THE INVENTION

The present invention relates to an ion injection device and a method therefor; and, in particular, the invention relates to an ion injection device which is suitable for implanting many types of ions, in particular oxygen ions, into a silicon wafer, and a method therefor.

In a conventional ion injection device, as disclosed, for example, in JP-A-1-189845 (1989), when an implanting ion beam was emitted from an ion source into a wafer disposed in a processing chamber, the incident angle of the ion beam with respect to the surface of the wafer was fixed at a predetermined angle.

These days, an ion injection device to be used for Separation by Implanted Oxygen (herein simply called SIMOX) has been developed, and in such an ion injection device, oxygen ions are injected into a silicon wafer to a predetermined depth, after which the silicon wafer is subjected to an annealing process to form an $SiO_2$ layer in the silicon wafer. By making use of the thus formed $SiO_2$ layer as an insulating substrate, a wafer having a higher response characteristic is realized in comparison with a conventional wafer in which a silicon layer is formed on a $SiO_2$ substrate.

SUMMARY OF THE INVENTION

However, it was found that, when an ion injection with SIMOX is performed by use of the conventional ion injection device, formation of a proper $SiO_2$ layer is difficult. The present inventors performed many investigations on the causes therefor and concluded that, in the conventional ion injection device, the incident angle of the ion beam with respect to the surface of the wafer is fixed to a predetermined angle, which is optimum for injecting ions other than oxygen ions; and, if oxygen ions are injected with such a predetermined angle, a so called channelling phenomenon, in which the oxygen ions collide with the lattice structure of the silicon, is induced, thereby preventing injection of the oxygen ions into the silicon wafer to an optimum depth, with the result that the formation of the $SiO_2$ layer in the silicon wafer at an optimum position is resultantly prevented.

An object of the present invention is to provide an ion injection device which permits the injection of an ion beam into a silicon wafer with an optimum injection angle for the ion beam.

Another object of the present invention is to provide a method of ion injection which permits an injection of oxygen ions into a silicon wafer to an optimum depth therein.

In order to achieve the foregoing objects, the ion injection device according to the present invention is characterized by the provision of a wafer holding means for holding a wafer into which ions from an ion beam emitted from an ion source are implanted; a relative position varying means for varying the relative position between the wafer holding means and the ion beam within a plane substantially perpendicular to the direction of the ion beam; and an incidence angle varying means for varying an incidence angle of the ion beam on the surface of the wafer held on the wafer holding means.

In the above ion injection device, according to the present invention, preferably, the wafer holding means is a rotatable disk which holds a plurality of wafers on the circumference thereof, and the relative position varying means is constituted by a rotating means which causes the rotatable disk to rotate in a plane substantially perpendicular to the direction of the ion beam and by a rocking means for rocking the rotatable disk in a plane substantially perpendicular to the direction of the ion beam.

In the above ion injection device according to the present invention, preferably, the device further comprises a control means for controlling at least one of the rotating speed of the rotating means and the rocking speed of the rocking means in such a manner that the moving speed v of the wafers, determined when a wafer moves across the ion beam due to the rocking motion of the rotatable disk produced by the rocking means, is inversely proportional to the rotating speed w of the wafer determined when the wafer moves across the ion beam due to the rotating motion of the rotatable disk produced by the rotating means.

In the above ion injection device according to the present invention, preferably, the wafer holding means is a wafer holder for holding the wafer at the opposite face from the face on which the ion beam is irradiated and the wafer holder is provided with an inclined portion so as not to be irradiated by the ion beam even when the incidence angle of the ion beam on the wafer with respect to the surface thereof is varied by a predetermined angle by the incidence angle varying means.

In the above ion injection device, according to the present invention, preferably, the wafer holder includes a stationary pin which is attached at the outer circumference of the wafer holder and engages with the side face of the wafer and a movable pin which is attached at the outer circumference of the wafer holder and engages with the side face of a wafer loaded on the upper face of the wafer holder and holds the same so as to permit the removal of the wafer from the wafer holder.

In the above ion injection device, according to the present invention, preferably, the wafer holder includes a plurality of pins which are movably attached at the outer circumference of the wafer holder and engage the side face of a wafer loaded on the upper face of the wafer holder and are each provided with a counter weight at an end thereof, and a seat which is attached at the outer circumference of the wafer holder and engages with the side face of the wafer loaded on the upper face of the wafer holder, so that through the rotation of the rotatable disk, the counter weight is moved due to an induced centrifugal force and the engagement between the wafer is released.

In the above ion injection device, according to the present invention, preferably, the wafer holder includes a recess used for holding the wafer on a face thereof inclined with respect to the rotating face of the rotatable disk and the wafer is held via the recess.

In the above ion injection device, according to the present invention, preferably, the device further comprises a heating means disposed at a position opposing a wafer held on the rotatable disk.

In the above ion injection device, according to the present invention, preferably, the device further comprises a temperature measuring means for measuring the temperature of a wafer held on the rotatable disk and a signal generating means for generating a reference trigger signal in synchronism with the rotation of the rotatable disk, wherein the temperature measuring means measures the temperature of the wafer at the timing of the reference trigger signal outputted from the signal generating means.

In the above ion injection device, according to the present invention, preferably, the device further comprises a wafer pick-up which makes it possible to insert a pin from the bottom portion of the wafer holding means through an opening provided in the wafer holding means after placing the wafer holding means in a horizontal position, so as to remove the wafer from the wafer holding means, the angle of the moving direction of the wafer pick-up with respect to the surface of the wafer being set below 90°.

In the above ion injection device, according to the present invention, preferably, the relative position varying means is designed to place a wafer held on the wafer holding means at a position away from the irradiating position of the ion beam during the initial period of the ion beam irradiation from the ion source.

In the above ion injection device, according to the present invention, preferably, the device further comprises an accommodating cassette for accommodating the wafer before and after being subjected to ion injection processing, a high temperature use cassette constituted by a heat resistant material for accommodating the wafer immediately after ion injection processing, and a transferring means for transferring the wafer mutually between the accommodating cassette, the high temperature use cassette and the wafer holding means, the transferring means being provided with a high temperature use arm constituted by a heat resistant material which removes the wafer immediately after the ion injection processing from the wafer holding means, and transfers and accommodates the same in the high temperature use cassette, and a low temperature use arm which transfers the wafer before ion injection processing from the accommodating cassette to the wafer holding means as well as transfers the wafer from the high temperature use cassette to the accommodating cassette after the ion injection processing.

In the above ion injection device, according to the present invention, preferably, the device further comprises, a preparation chamber containing the accommodating cassette, the high temperature use cassette and the transferring means therein, a processing chamber containing the wafer holding means, the relative position varying means and the incidence angle varying means therein and a sealing off valve which hermetically seals off the preparation chamber from the processing chamber, and after completion of the ion injection processing, the wafer is accommodated in the high temperature use cassette and a wafer yet to be subjected to the ion injection processing is held on the wafer holding means, and the preparation chamber and the processing chamber are separated in an air tight manner and the preparation chamber is gas-purged.

Further, in order to achieve the above objects, the method of ion injection according to the present invention is performed in such a way that, when the ion beam emitted from an ion source is implanted into a wafer, oxygen ions from the ion source are implanted into the wafer while varying the incidence angle of the ion beam on the surface of the wafer.

In the above method of ion injection, according to the present invention, preferably, a plurality of wafers are held along a circumference, the wafers are rotated in a plane substantially perpendicular to the direction of the ion beam and the wafers are rocked in a plane substantially perpendicular to the direction of the ion beam.

In the above method of ion injection, according to the present invention, preferably, at least one of the rotating speed and the rocking speed is controlled in such a manner that the moving speed v of a wafer determined when the wafer moves across the ion beam through the rocking motion is inversely proportional to the rotating speed w of the wafer determined when the wafer moves across the ion beam as a result of the rotating motion.

In the above method of ion injection, according to the present invention, preferably, the temperature of the rotating wafer is measured in synchronism with the rotation of the rotating wafer.

BRIEF DESCRIPTION OF THE DRAWINGS

FIG. 6(a) and FIG. 6(b) are diagrams of another wafer holder in the ion injection device of the embodiment according to the present invention, wherein FIG. 6(a) shows a plane view thereof and FIG. 6(b) shows a cross sectional view thereof;

FIGS. 7(a), 7(b), 7(c) and 7(d) are diagrams of still another wafer holder in the ion injection device of the embodiment according to the present invention, wherein FIG. 7(a) is a plane view thereof, FIG. 7(b) is a cross sectional view taken along the line $VII_b$—$VII_b$ in FIG. 7(a), FIG. 7(c) is a cross sectional view taken along the line $VII_c$—$VII_c$ in FIG. 7(a) and FIG. 7(d) is a cross sectional view showing another functional state of FIG. 7(c);

DESCRIPTION OF THE PREFERRED EMBODIMENTS

Figure 1:
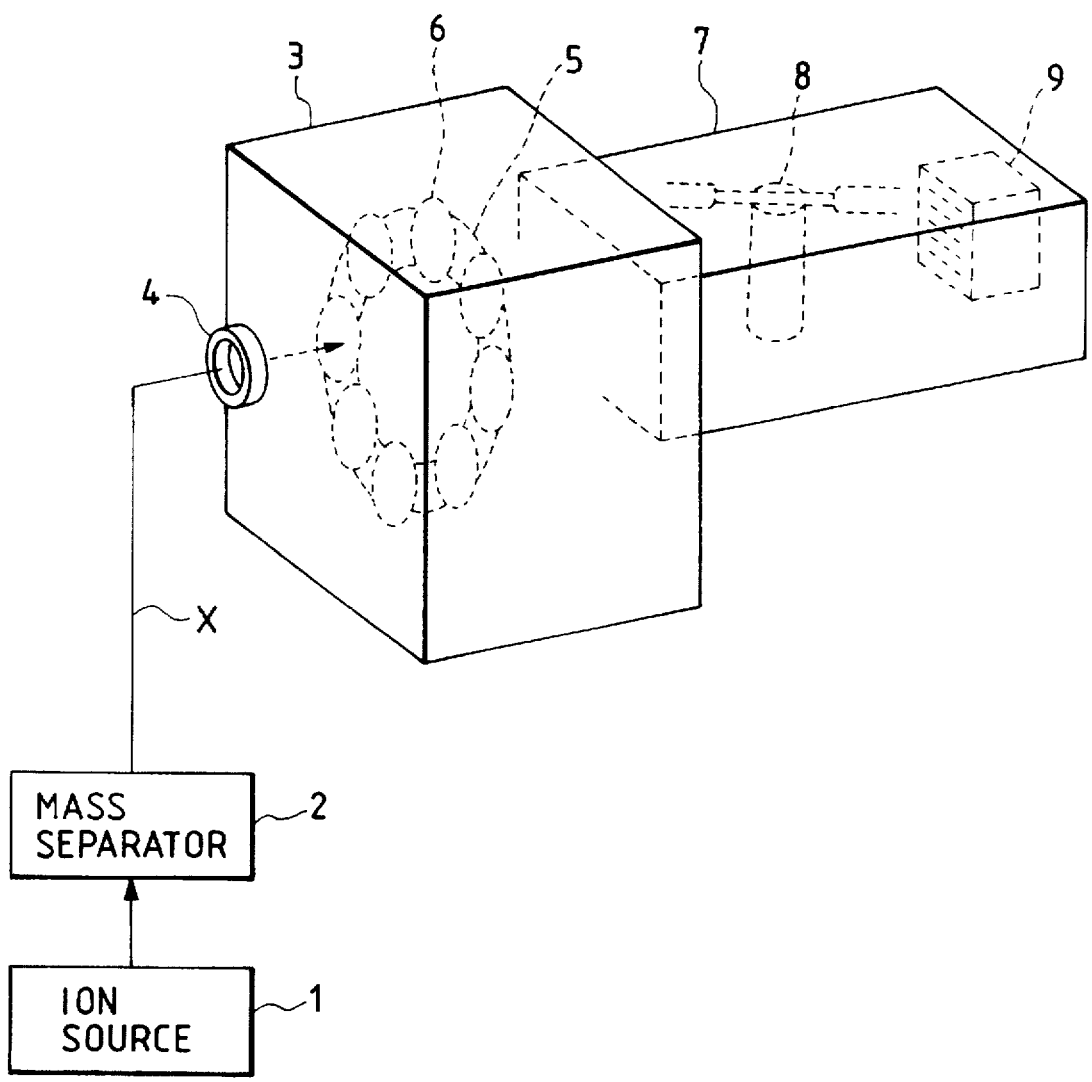
FIG. 1 is a schematic view of the overall construction of one embodiment of an ion injection device according to the present invention.

Hereinbelow, the present invention will be explained in detail with reference to the embodiments illustrated in the drawings.

FIG. 1 shows a schematic view of an ion injection device used for SIMOX representing one embodiment according to the present invention.

As illustrated in FIG. 1, in the ion beam emitted from an ion source 1, ions having a predetermined mass, i.e., as used for ion injection, for example, oxygen ions, are separated and taken out via a mass separator 2. An ion beam X taken out by the mass separator 2 is directed into a processing chamber 3 via an incident opening 4 of the processing chamber 3. The ion source 1, mass separator 2 and the processing chamber 3 are connected in an air tight manner and the inside thereof is kept in a vacuum.

In the processing chamber 3 a rotatable disk 5 is disposed, along the circumference of the rotatable disk 5 a plurality of wafer holders are arranged and on the wafer holders respective silicon wafers are mounted. The rotatable disk 5 is mounted to have a rotating motion, as well as a rocking motion in right and left directions. Since the cross sectional area of the ion beam X is small in comparison with the area of the silicon wafer mounted on the wafer holder 6, through the rotation and rocking of the rotatable disk 5, the intended ion implantation can be performed over the entire surface of the silicon wafer.

At the back side of the processing chamber 3 a preparation chamber 7 is connected into which wafers to be subjected to ion injection are carried in and out. In the preparation chamber 7 there is a transferring robot 8 which performs transfer of the wafers and an accommodating cassette 9 for accommodating the wafers. The transferring robot takes out a wafer accommodated in the accommodating cassette 9, inserts the top end thereof into the processing chamber 3 and loads the wafer on the wafer holder 6. Further, the transferring robot 8 detaches the wafer from the wafer holder 6 after ion injection has been completed and accommodates the same in the accommodating cassette 9.

An end station for the ion injection device is constituted by the processing chamber 3 and the preparation chamber 7.

The structure of the rotatable disk 5 in the processing chamber 3 will be explained with reference to FIGS. 2 and 3.

Figure 2:
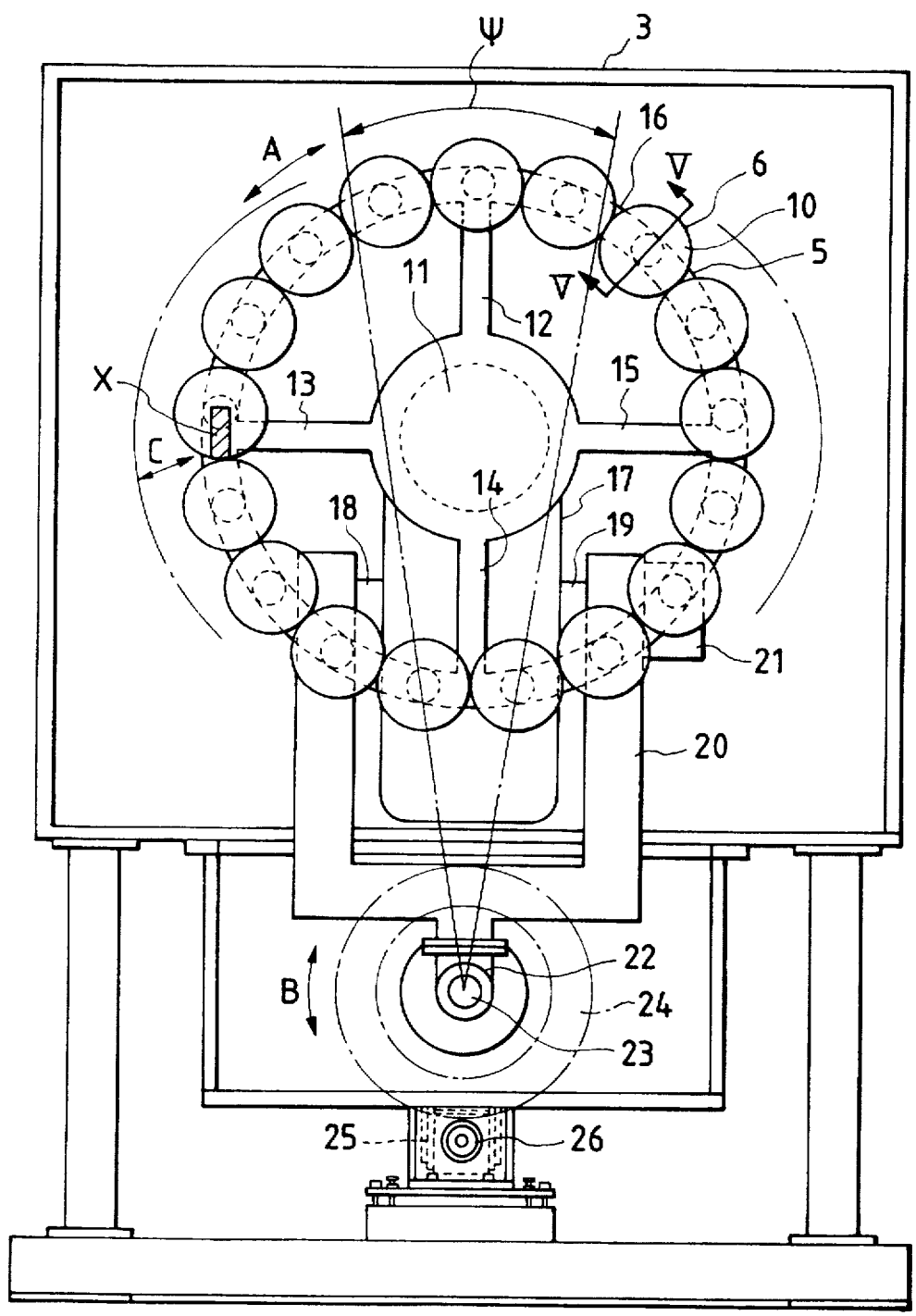
FIG. 2 is a front view showing a rotatable disk device employed in the ion injection device of the embodiment according to the present invention.

In FIG. 2, seventeen wafer holders 6 each being loaded with a wafer 10 are arranged along the circumference of the rotatable disk 5 with an equal pitch and the ion beam X is irradiated onto any required wafer position on the rotatable disk 5. The rotatable disk 5 is constituted by a hub portion 11 located at the center thereof, four arm portions 12, 13, 14 and 15 extending from the hub portion 11 with equal angular spacing of 90° in a cross shape and a ring portion 16 arranged along the outer circumference of the arm portions 12, 13, 14 and 15. The seventeen wafer holders 6 are attached on the ring portion 16. At the back side of the center hub portion 11 an inner chamber 17 containing a motor therein is attached and the rotating force of the motor is transmitted to the rotatable disk 5 to rotate the same in the directions of an arrow A. The details of the inner chamber 17 will be explained later with reference to FIG. 3.

The inner chamber 17 is rotatably supported by a U shaped shaft 20 via tilt axes 18 and 19 from the right and left side thereof; on the shaft 20 a motor 21 is secured; the rotating axis of the motor 21 is connected to the end portion of the axis 19; and through normal or reverse rotation of the motor 21 the rotatable disk 5 is rotated around the tilt axes 18 and 19 so as to permit variation of the inclination angle with respect to the ion beam X.

The U shaped shaft 20 is secured at the base portion thereof to a shaft 22 and the shaft 22 is then secured to a scanning axis 23. At an end of the scanning axis 23 a gear 24 is secured. The gear 24 is engaged with another gear 26 secured to the rotating axis of a motor 25. Accordingly, through normal and reverse rotation of the motor 25 the gear 24 performs normal and reverse rotation as indicated by the directions of an arrow B to thereby cause a rocking movement of the rotatable disk 5 in the directions of an arrow C. The rocking angle thereof is ψ as illustrated in the drawing. Since the position of the ion beam X is fixed, through the rocking movement of the rotatable disk 5 the upper surface of the wafers 10 can be scanned relatively by the ion beam X.

Now the tilt mechanism for the rotatable disk 5 will be explained with reference to FIG. 3.

Figure 3:
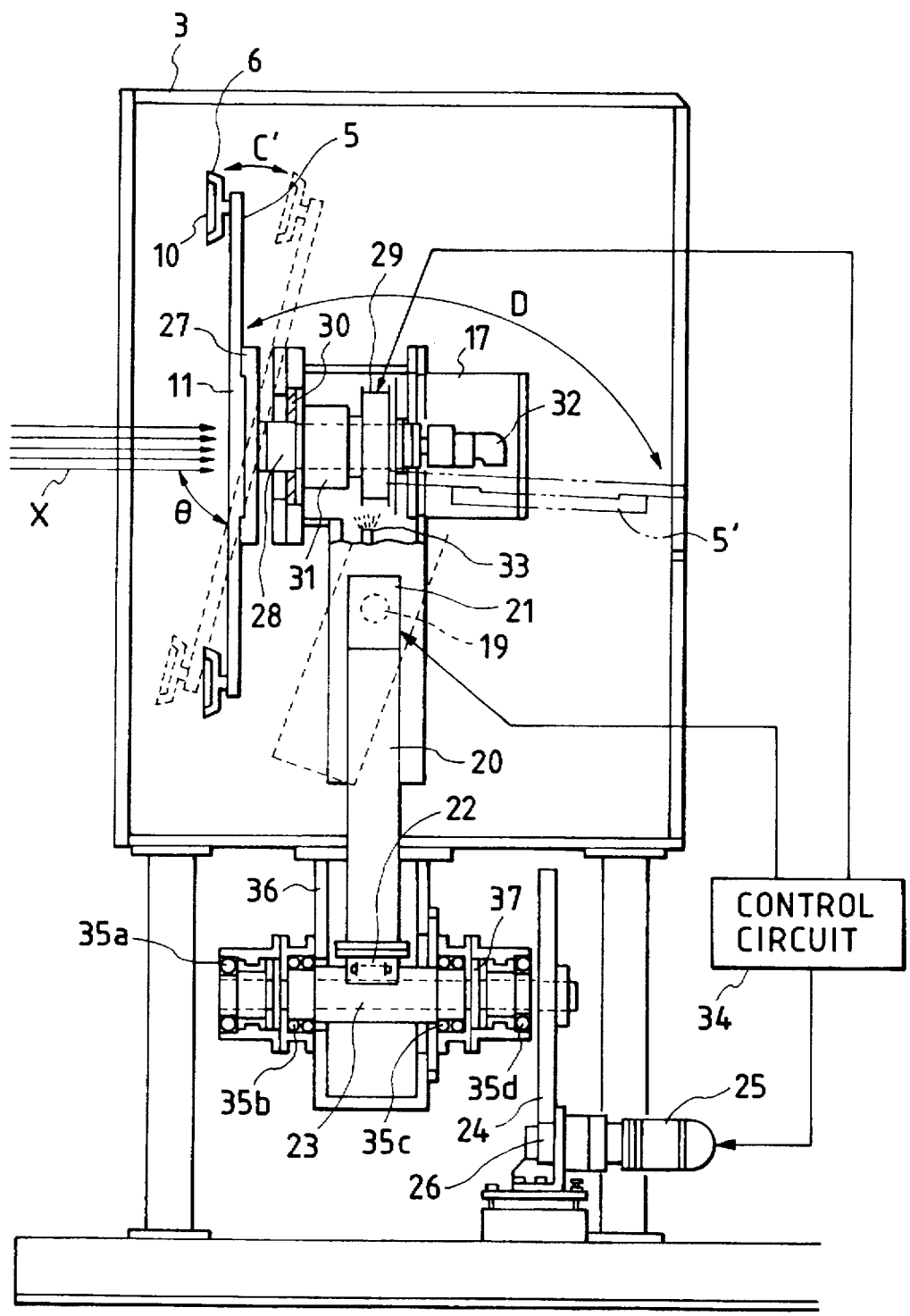
FIG. 3 is a side view of the device shown in FIG. 2.

In FIG. 3, the wafer holders 6 each being loaded with a wafer 10 are arranged on the outer circumference of the rotatable disk 5 and the ion beam X is irradiated onto any required wafer position on the rotatable disk 5. At the back side of the center hub portion 11 of the rotatable disk 5 a disk like seat 27 is connected via a spigot joint. A shaft 28 attached to the disk like seat 27 is connected to the rotating axis of a motor 29. Further, the shaft 28 is rotatably supported from the inner chamber 17 via an insulating member 30 so as to permit free rotation thereof. To the motor 29 a magnetic seal 31 is attached and a supply and exhaust port 32 for cooling water is also attached to cool the motor 29. The inner chamber 7 in which the motor 29 is disposed is kept at atmospheric pressure, while the outside thereof is kept at a vacuum, therefore the magnetic sealing member 31 is provided for sealing the inside of the inner chamber 17. Since the inside of the inner chamber 17 is kept at the atmospheric pressure, a dry air blow-out port 33 is provided inside the inner chamber 17 so as to introduce dry air into the inner chamber 17. This is because the motor 29 is permitted to operate at atmospheric pressure and is designed to be water-cooled, and so it is possible dew condensation will be produced inside the inner chamber 17; accordingly, dry air is taken in from the outside into the inner chamber 17 to dry the same and to prevent dew condensation from forming therein.

The inner chamber 17 is rotatably supported by a U shaped shaft 20 via tilt axes 18 and 19 from the right and left side thereof; on the shaft 20 a motor 21 is secured, the rotating axis of the motor 21 being connected to the end portion of the axis 19; and through normal or reverse rotation of the motor 21, the rotatable disk 5 can be rotated around the tilt axes 18 and 19 in the directions of an arrow D. Through rotation of the rotatable disk 5 from the position indicated by solid lines to the position indicated by dotted lines in the direction of an arrow C' an inclination angle θ of the wafer 10 with respect to the ion beam X can be varied.

A servo motor is used for the motor 21 and the rotation of the motor 21 is detected by pulses outputted from an encoder attached on the rotating axis of the motor 21. In order to vary the inclination angle θ of the wafer 10, a motor control circuit 34 supplies a predetermined number of pulses which corresponds to the required inclination angle of the rotatable disk 5 to the motor 21 to rotate the same, and at the same time counts the number of pulses outputted from the encoder in association with the rotation thereof and the motor 21 is continued to be rotated until the number of pulses from both are equated so that the rotatable disk 5 is inclined to a predetermined angle θ. In the present embodiment three kinds of inclination angles of 7°, 14° and 28° from the conventional position indicated by solid lines in FIG. 3 are selected. In other words, the angle of the rotatable disk 5 can be controlled to assume three angles θ of 83°, 76° and 62° as in FIG. 3.

Further, when replacing the wafer 10, the motor 21 is driven via a control signal from the motor control circuit 34, and the rotatable disk 5 in the position indicated by the solid lines is rotated to the position 5' indicated by the two chain lines in the direction of an arrow D, after which a replacing operation is performed under the condition that the rotatable disk 5 is disposed horizontally.

The shaft 20 at the base thereof is secured by welding to the shaft 22, and the shaft 22 is then secured to the scanning axis 23. The scanning axis 23 is rotatably supported by a housing 36 via four bearings 35a, 35b, 35c and 35d. At the right end portion of the scanning axis 23 the gear 24 is secured. The gear 24 engages with the gear 26 secured to the rotating axis of the motor 25. Accordingly, when the motor 25 is rotated in normal or reverse directions in response to a control signal from the motor control circuit 34, the rotatable disk 5 is rocked. The rocking angle ψ is detected by an encoder 37 attached to the scanning axis 23.

As explained above, the rotatable disk 5 is rotated by the motor 29 which is disposed at the center portion of the rotatable disk 5. Further, the motor 29 is disposed in the inner chamber 17 of which the inside is kept at atmospheric pressure. The rotatable disk 5 is structured to permit inclination around the tilt axes 18 and 19 so that the ion injection angle θ can be varied with respect to the ion beam X. Further, the rotatable disk 5 is structured to permit a reciprocable arcuate motion with a scanning angle ψ around the scanning axis 23 so that the entire surface of a wafer is irradiated by the ion beam X.

Therefore, according to the present embodiment, since the rotatable disk 5 is structured to permit inclination around the tilt axes 18 and 19, the implanting angle (beam incident angle) representing the angle when ions are implanted into a wafer 10 can be varied; therefore, an optimum ion implanting can be realized in view of the channelling phenomenon which is induced when ions are implanted into the wafer 10. Accordingly, when the present embodiment is used for as an ion injection device for SIMOX, an optimum $SiO_2$ layer is formed and an SIMOX silicon wafer exhibiting a higher response speed is manufactured.

Further, in accordance with the present invention, the wafers 10 loaded on the rotatable disk 5 is moved instead of moving the ion beam, and therefore the distribution of injected ions is uniformalized. Namely, in the conventional method in which the ion beam itself is scanned by means of a variable magnetic field, the density of the ion beam is varied depending on the scanning operation by the magnetic field. Contrary thereto, in accordance with the present invention, since the rotatable disk 5 on which the wafers 10 are loaded is rotated without moving the ion beam itself, no variation in ion beam density is caused and an ion injection of uniform density can be realized. Further, a uniform distribution of ion injection is achieved by rocking the rotatable disk 5 around the scanning axes 18 and 19. Still further, in place of the rocking movement of the rotatable disk 5, another mechanism can be used to cause a similar reciprocating movement of the rotatable disk 5. Regardless of the mechanisms causing such reciprocating movement, in order to irradiate the ion beams successively onto the plurality of wafers 10, the wafers 10 are rotated as well as moved reciprocally in the direction perpendicular to the rotating direction thereof, and the ion beam is irradiated onto the surfaces of the respective wafers while varying the positions thereof on the surfaces of the respective wafers 10.

Now, the rocking motion of the rotatable disk 5 will be explained with reference to FIG. 4.

Figure 4:
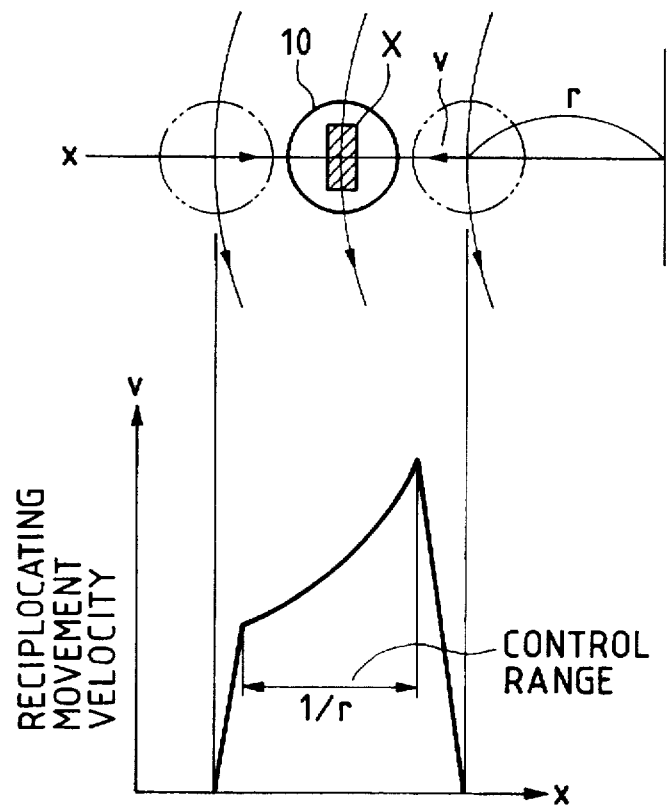
FIG. 4 is a diagram showing a relationship between the wafer position due to rocking of a rotatable disk in the ion injection device of the embodiment according to the present invention and the moving speed of the wafer at that moment.

FIG. 4 shows a relationship between the position of a wafer determined by the rocking motion caused by the rotatable disk 5 in the ion injection device of the embodiment according to the present invention and the moving speed of the wafer 10 at that moment.

As explained above, the rotatable disk 5 carrying the wafer holders 6 is rotated by the motor 29, and the rotatable disk 5 performs a reciprocating arcuate movement around the scanning axis 23, whereby the ion beam X is irradiated on the surfaces of the respective wafers 10. In such operation, since the cross sectional size of the irradiating ion beam X is small with respect to the surface of the respective wafers 10, the surface of the respective wafers 10 moves across the ion beam X through the two motions thereof, i.e., the rotating motion and the scanning motion. However, with regard to the rotating motion, since the rotating circumferential speed of a wafer 10 near the outer diameter of the rotatable disk 5 and the speed near the inner diameter thereof are different, the amounts of injected ions per unit time into the wafer 10 are different when the ion beam X is irradiated onto the respective portions, which poses a problem with regard to uniformity. Therefore, the speed of reciprocating movement for the scanning is controlled as illustrated in FIG. 4. Namely, with regard to the reciprocating movement for the scanning of the rotatable disk 5, when assuming that the distance between the center of rotatable disk 5 and irradiating position of the ion beam X is r and the speed of the reciprocating operation is v, the speed v of the reciprocating movement for the scanning operation is determined by the following function as illustrated in FIG. 4:

$$v = f(1/r)$$

thereby, the ion injection amounts per unit time onto the wafer 10 are equalized over the entire surface thereof. Since the distance r is in proportion to rotating circumferential speed w of the wafer 10, the above equation can be similarly expressed as follows:

$$v = f(1/w)$$

therefore, the motor control circuit 34 controls the rotating speed of the motor 25 so as to satisfy the above equation between the rotating circumferential speed w of the wafer 10 and the reciprocating moving speed v of the wafer 10. At this instance, the rotating position of the shaft 20 is detected by the encoder 37 attached to the scanning axis 23 and the rotating speed of the motor 25 is controlled based on the detected value. As illustrated in FIG. 4, only in the controllable range of 1/r will the ion beam X irradiate the surface of the wafer 10, and so it is enough to perform control satisfying the equation only in the applicable range of 1/r.

According to the present embodiment, by controlling the relative speed between the wafer 10 and the ion beam X in a predetermined relationship, the irradiation of the ion beam X per unit time on the surface of the wafer 10 is uniformalized over the entire surface of the wafer 10.

Now, the structure of a wafer holder 6 will be explained with reference to FIG. 5.

Figure 5:
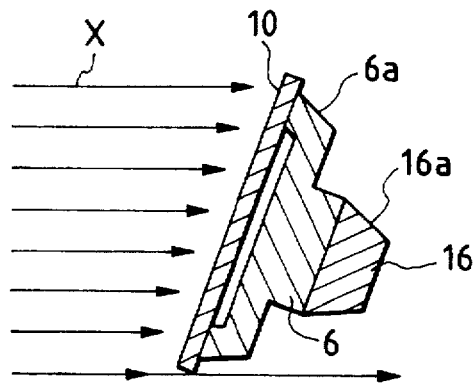
FIG. 5 is a lateral cross sectional view taken along the line V—V in FIG. 2 of a wafer holder in the ion injection device of the embodiment according to the present invention.

In order that no ion beam X impinges to areas such as the side face of the rotatable disk 5 and the side face of the wafer holder 6 when the rotatable disk 5 is inclined, such as side face 16a of a ring portion 16 of the rotatable disk 5 and a side face 6a of the wafer holder 6 are structured to be slanted in the cross section thereof as shown in FIG. 5.

According to the present embodiment, the injection angle of the ion beam X is designed to be varied; therefore, when the injection angle of the ion beam X is varied, the wafer holding portion of the wafer holder 6 and the ring portion 16 of the rotatable disk 5 incline with respect to the ion beam X. However, with the provision of the slanted portions at the side walls of the wafer holding portion of the wafer holder 6 and the ring portion 16 of the rotatable disk 5, the impingement of the ion beam X is prevented.

Wafer holding structures of other wafer holders 6 will be explained with reference to FIG. 6(a) through FIG. 10.

Figure 6A:
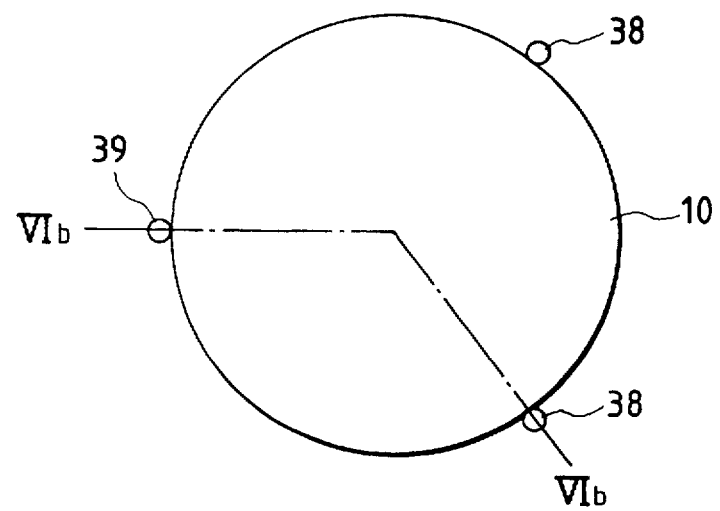
Figure 6B:
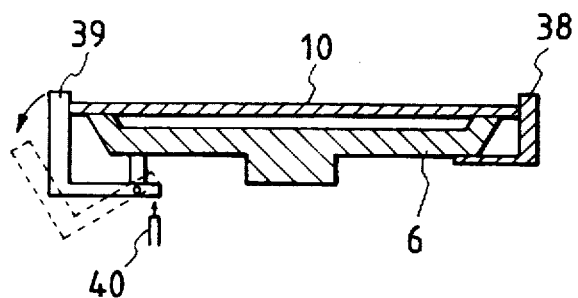

FIG. 6(a) shows an embodiment of a wafer holder used in the ion injection device of the embodiment according to the present invention, and FIG. 6(b) shows a cross sectional view taken along the line $VI_b$-$VIb_b$ in FIG. 6(a).

The bottom of the wafer 10 is held by a wafer holder 6 made of aluminum. At the upper face of the wafer holder 6 a recess is formed so that the wafer 10 contacts the upper face of the wafer holder only at the outer circumference thereof. The wafer 10 is chucked from the side face thereof by two column shaped stationary pins 38 and a column shaped movable pin 39. The stationary pins 38 and the movable pin 39 are made of $SiO_2$ or Si.

Through upward and downward movement of a wafer chuck releasing pin 40 disposed below the movable pin 39, the movable pin 39 can be moved to the position indicated by dotted lines to thereby perform the attachment and detachment of the wafer 10.

When fixing the wafer 10 with the wafer holder 6, it is important to keep in mind the following points. The upper face of the wafer 10 should not be pressed, generation of dust due to rubbing should be prevented by limiting contact with the wafer 10 as much as possible and generation of flaws and the like due to excess pressing force thereon also should be prevented.

According to the present embodiment, the surfaces of the wafer 10 which come into contact with the wafer holder 6 are limited only to the upper and outer circumferential faces of the wafer holder 6, the two stationary pins 38 and the movable pin 39, and the wafer 10 is sufficiently held by contacting surfaces of a limited area. Accordingly, application of an unnecessarily large force on the wafer 10 is prevented.

Figure 7A:
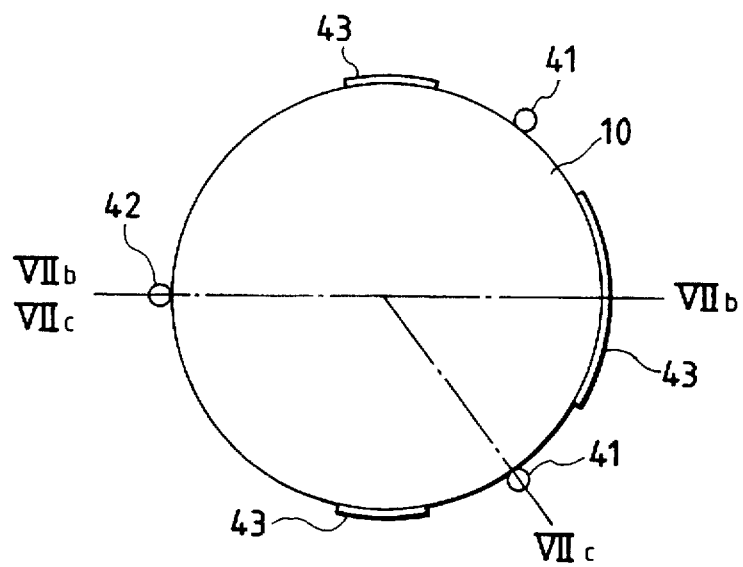
Figure 7B:
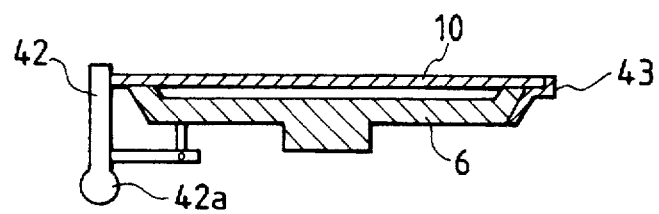
Figure 7C:
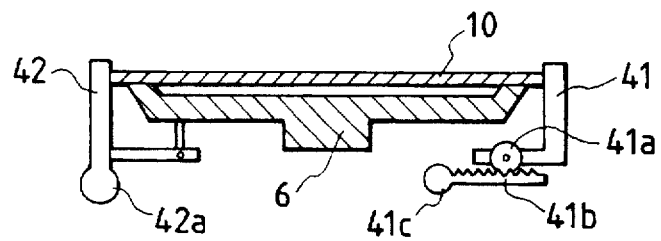
Figure 7D:
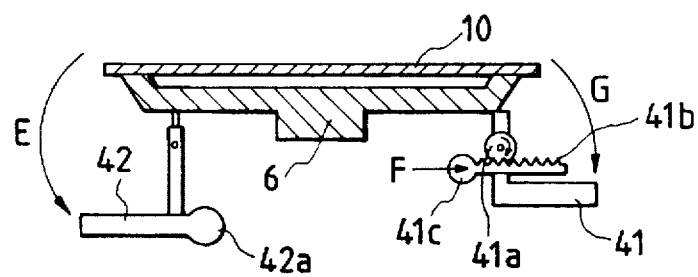

FIG. 7(a) shows another embodiment of the wafer holders 6 in the ion injection device of the embodiment according to the present invention. FIG. 7(b) shows a cross sectional view taken along the line $VII_b$—$VII_b$ in FIG. 7(a), FIG. 7(c) shows a cross sectional view taken along the line $VII_c$—$VII_c$ in FIG. 7(a) and FIG. 7(d) shows a cross sectional view illustrating another operating state than that shown in FIG. 7(c).

The bottom of the wafer 10 is held by the wafer holder 6. At the upper face of the wafer holder 6 a recess is formed so that the wafer 10 contacts the upper face of the wafer holder 6 only at the outer circumference thereof. The wafer 10 is chucked from the side face thereof by two column shaped pins 41 and a column shaped pin 42.

Further, the side face of the wafer 10 is held by seats 43 secured at three points around the circumference of the wafer holder 6. The seats 43 are made of $SiO_2$ or Si.

At the lower end of the pin 42, a counter weight 42a is provided. Accordingly, when the rotatable disk 5 is rotated, the counter weight 42a is displaced because of the centrifugal force applied thereto, the pin 42 is displaced in the direction of an arrow E and the pin 42 moves away from the side face of the wafer 10. Further, at the rotating axis of the pin 41, a gear 41a is provided and the gear 41a is engaged with a rack 41b. Since a counter weight 41c is provided at one end of the rack 41b, when the rotatable disk 5 is rotated, the counter weight 41c moves in the direction of an arrow F due to the centrifugal force applied thereto, and the gear 41a is rotated to rotate the pin 41 in the direction of an arrow G, whereby the pin 41 moves away from the side face of the wafer 10.

However, the wafer 10 is pushed against the seats 43, and thereby held on the wafer holder 6.

According to the present embodiment, the surfaces of the wafer 10 which are in contact with the wafer holder 6 are limited only to the upper and outer circumferential surfaces of the wafer holder 6, the two pins 41 and the movable pin 42, and so the wafer 10 is sufficiently held by contacting surfaces of a limited area. Accordingly, application of an unnecessarily large force on the wafer 10 is prevented.

Further, the wafer holder 6 is structured to prevent the movement of the wafer 10 due to a centrifugal force by the seats 43, so that the force applied to the wafer can be limited.

Still further, the wafer holder 6 6 is structured to withdraw the pins 41 and 42 below the wafer holder 6 when the rotatable disk 5 is rotated and the ion beam X is irradiated onto the wafer 10, so that irradiation of the pins 41 and 42 by the ion beam X is prevented.

Figure 8:
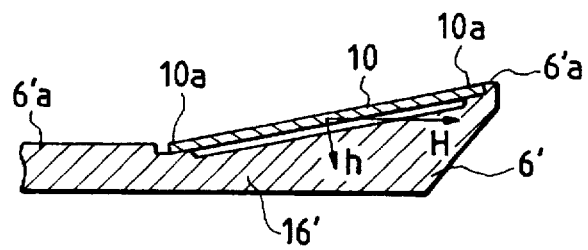
FIG. 8 is a cross sectional view of a further wafer holder in the ion injection device of the embodiment according to the present invention.

FIG. 8 shows a cross sectional view of still another embodiment of a wafer holder in the ion injection device of the embodiment according to the present invention.

A wafer holder 6' is formed integrally with a ring portion 16' of the rotatable disk 5 and is structured to hold the wafer 10 only by the centrifugal force acting thereon while eliminating the use of pins for chucking. At the upper face of the wafer holder 6' made of aluminum, a recess is formed so as to reduce the contacting area with the wafer 10. Because the wafer holding face of the wafer holder 6' is slightly inclined, a force component h of the centrifugal force H acts as a force pushing the wafer 10 onto the wafer holder 6'.

Further, the wafer holder 6' is structured so that the wafer 10 is recessed in the surface thereof and the levels of the face of the wafer 10 and the face of a wafer holding portion 6'a are aligned, whereby the deposition of foreign material on the back face of the wafer 10 due to ion beam spattering is suppressed.

According to the present invention, the wafer 10 is sufficiently held by a limited contact surface area.

Further, the levels of the face of the wafer 10 and the surface of a wafer holding portion 6'a are aligned, whereby the deposition of foreign material on the front face of the wafer 10 due to ion beam spattering is also suppressed.

Figure 9A:
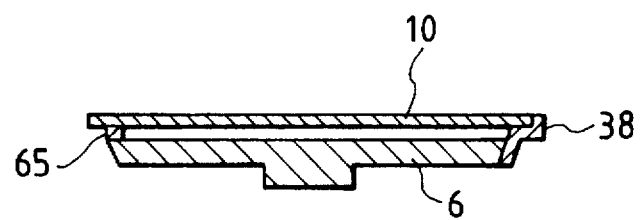
FIG. 9(a), FIG. 9(b) and FIG. 9(c) are cross sectional views showing, respectively, further embodiments of wafer holders used in the embodiment of the ion injection device according to the present invention.
Figure 9B:
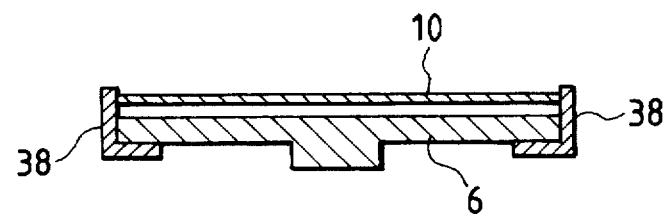
Figure 9C:
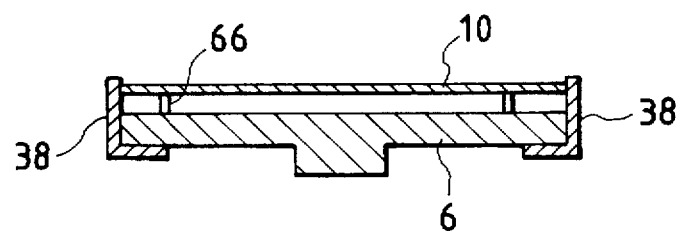

FIGS. 9(a), 9(b) and 9(c) show further embodiments of wafer holders employed in the ion injection device according to the present invention.

In the FIG. 9(a) embodiment, the wafer holder 6 is provided with a stationary pin 38 at the outer circumference thereof and a contacting seat 65 formed on the surface thereof at the opposite side where the stationary pin 38 is disposed, and the wafer 10 is held by the stationary pin 38 and the contacting seat 65.

In the FIG. 9(b) embodiment, the wafer holder 6 is provided with a plurality of stationary pins 38 and the wafer 10 is held through the contact between the stationary pins 38 and the side face of the wafer 10.

In the FIG. 9(c) embodiment, in addition to the FIG. 9(b) embodiment, the wafer holder 6 is further provided with a plurality of contacting seats 66 on the upper surface thereof and the wafer 10 is held by the contact between the stationary pins 38 and the side face of the wafer 10, as well as by the point contacts between the bottom face of the wafer 10 and the contacting seats 66.

According to the above three embodiments of wafer holders, the heating energy inputted into the wafer 10 escapes through the holding portions, such as the stationary pins 38 and the contacting seats 65 and 66, and so a temperature decrease and non-uniform temperature distribution of the wafer 10 are prevented and dielectric breakdown between the wafer 10 and other components nearby due to electrostatic charging of the wafer 10 is also prevented.

Figure 10:
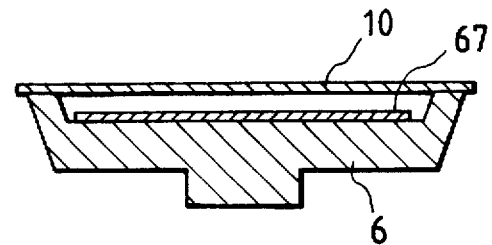
FIG. 10 is a cross sectional view showing a still further embodiment of a wafer holder used in the embodiment of the ion injection device according to the present invention.

FIG. 10 shows a further embodiment of a wafer holder which may be used in the ion injection device according to the present invention. In the FIG. 10 embodiment, the wafer 10 is held by the wafer holder 6 at the bottom periphery of the wafer 10, and in the space at the center of the wafer holder 6 formed between the wafer 10 and the wafer holder 6, a heat radiation plate 67, made of a material such as Si, having a heat radiation rate different from that of the wafer holder 6 is disposed.

According to the present embodiment, through selection of the heat radiation plate 67 having a different heat radiation rate from the wafer holder 6, the amount of heat radiated from the wafer 10 is controlled, whereby the temperature of the wafer 10 can be controlled.

Now, a heating device in the embodiment of the ion injection device according to the present invention will be explained with reference to FIG. 11.

Figure 11:
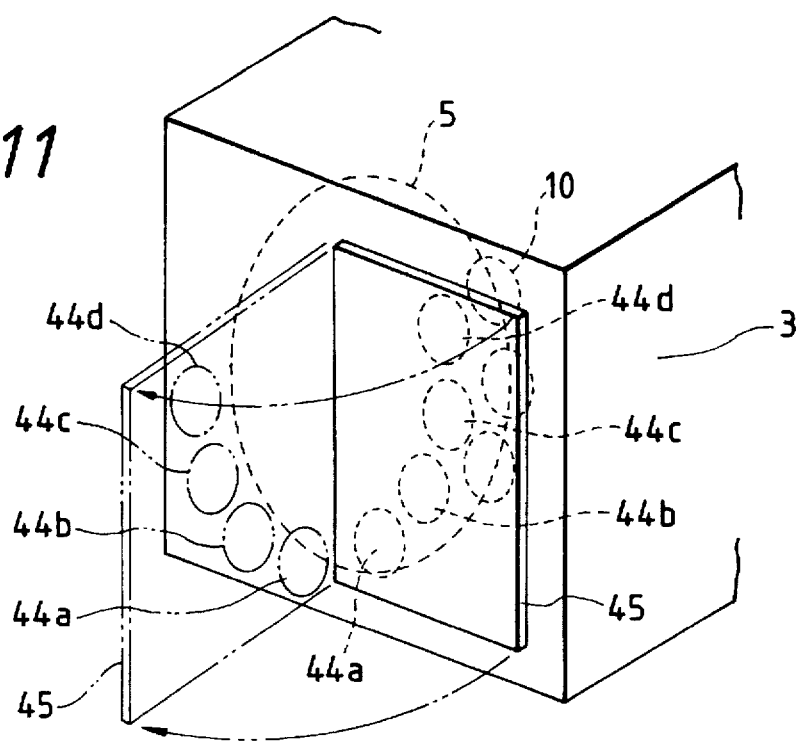
FIG. 11 is a perspective view of a part of a processing chamber showing the arrangement of a heating device employed in the ion injection device of the embodiment according to the present invention.

As shown in FIG. 11, round shape lamp heaters 44a, 44b, 44c and 44d are disposed on a door 45 of the processing chamber 3 so as to face the respective wafers 10 loaded on the rotatable disk 5 along the circumference thereof. By arranging the positions of the lamp heaters 44a, 44b, 44c and 44d to match the respective positions of the wafers 10, the respective wafers 10 are efficiently heated. Further, since the lamp heaters 44a, 44b, 44c and 44d are expendable products and replacement thereof is frequently required, the lamp heaters 44a, 44b, 44c and 44d are disposed on the inside face of the door 45 constituting a part of the processing chamber 3 serving as a vacuum vessel.

The lamp heaters 44a, 44b, 44c and 44d are used to preliminarily heat the wafers 10 up to a predetermined temperature prior to performing ion injecting operation. After the preliminary heating, the ions are injected into the wafers 10, and even during the ion injection the wafers 10 are supplementally heated by the lamp heaters 44a, 44b, 44c and 44d so as to maintain the temperature of the wafers 10 at a predetermined temperature.

According to the present embodiment, with the lamp heaters 44a, 44b, 44c and 44d the preliminary heating of the wafers 10 as well as the supplemental heating thereof during the ion injecting operation can be performed.

Further, since the lamp heaters 44a, 44b, 44c and 44d are attached to the door 45 of the processing chamber 3, the replacement of the lamp heaters 44a, 44b, 44c and 44d is facilitated.

Now, a temperature measurement device for the wafers 10 which are loaded on the rotatable disk 5 will be explained with reference to FIG. 12.

Figure 12:
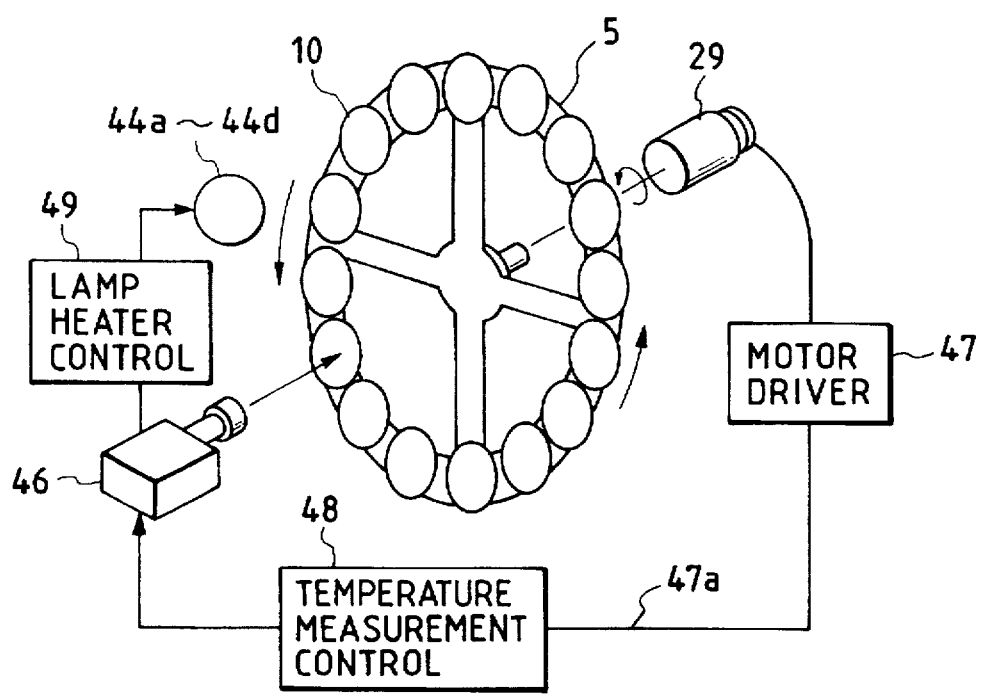
FIG. 12 is a schematic view of a wafer temperature measuring means employed in the ion injection device of the embodiment according to the present invention.

As illustrated in FIG. 12, at the position facing a wafer 10 inside the processing chamber 3, a noncontacting type thermometer 46 is disposed. With the non-contacting type thermometer 46, the temperature of the respective wafers 10, which are heated by the lamp heaters 44a, 44b, 44c and 44d, is measured. At this moment, since the rotatable disk 5 is rotated at a high speed of, for example, 500 rpm, the temperature measurement is performed in synchronism with the rotation of the motor 29 for rotating the rotatable disk 5 so as to correctly measure the temperature of the wafers 10. Namely, a motor driver 47 driving the motor 29 outputs a pulse like reference position trigger signal 47a for every one revolution of the rotatable disk 5 as a signal in synchronism with the rotation of the motor 29, and the pulse like reference position trigger signal 47a is transmitted to a temperature measurement control unit 48 to perform the temperature measurement in synchronism with the rotation of the rotatable disk 5. In this case, since the motor driver 47 is designed to output one pulse for every one revolution of the rotatable disk 5, the temperature of the same wafer on the rotatable disk 5 is always measured.

A signal representing the temperature of a wafer 10 measured by the non-contacting type thermometer 46 is inputted into a lamp heater control circuit 49 which controls the supply current to the lamp heaters 44a, 44b, 44c and 44d so as to maintain the temperature of the wafer 10 at a predetermined temperature.

According to the present embodiment, since the temperature of the wafer 10 is designed to be measured in synchronism with the revolution of the rotatable disk 5, the temperature measurement is performed accurately.

Figure 13:
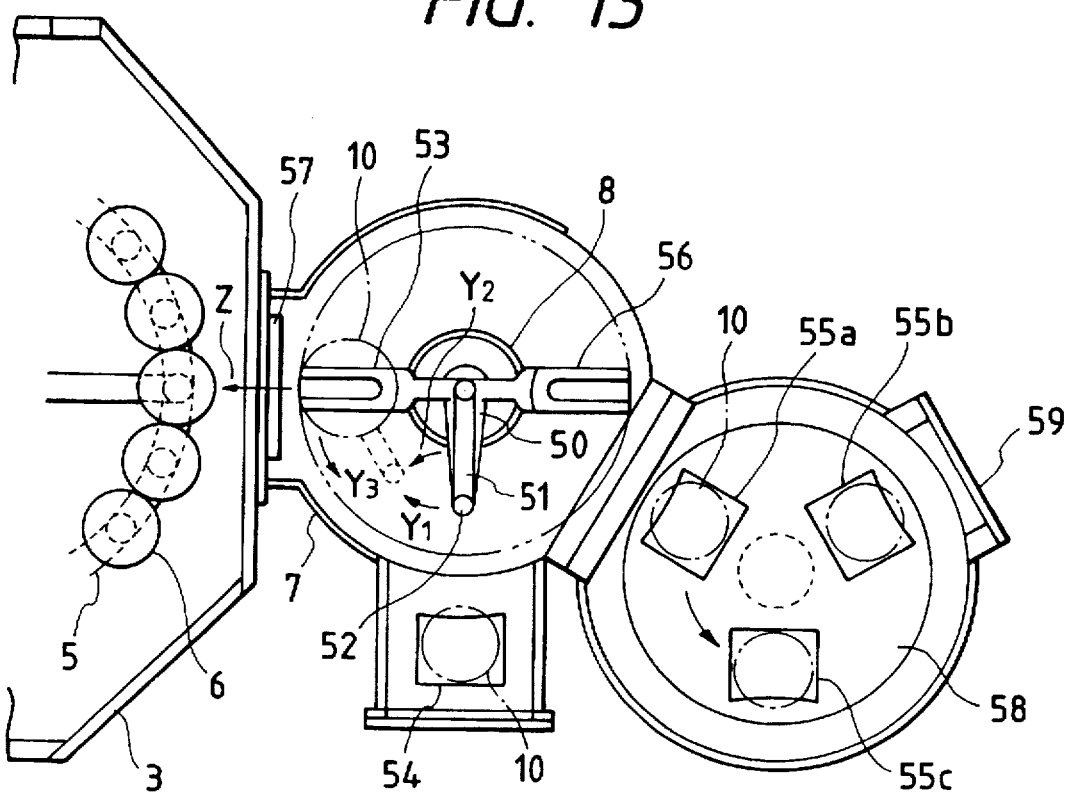
FIG. 13 is a plane view showing a processing chamber and a preparation chamber employed in the ion injection device of the embodiment according to the present invention.

Now, the details of the structure of the preparation chamber 7 will be explained with reference to FIG. 13.

In the processing chamber 3, a plurality of wafers 10 are held on the rotatable disk 5. During loading and unloading of the wafers 10 on the rotatable disk 5, the rotatable disk 5 is inclined to its horizontal position. Namely, under the condition indicated by solid lines in FIG. 3, the rotatable disk 5 is disposed in a vertical position, and when performing the loading and unloading operation, the rotatable disk 5 is rotated around the tilt axis 19 to the horizontal position indicated by the two dot chain lines.

A high temperature wafer 10 for which the ion injection has been completed in the processing chamber 3 is carried out from the processing chamber 3 with a high temperature use arm 53 assembled to a transferring robot 8. The high temperature use arm 53 is made of a heat resistant material such as ceramic. At the rotation center of the transferring robot 8, a rotatable lower arm 50 is coupled and at the other end of the rotatable lower arm 50 a rotatable upper arm 51 is coupled. Through driving of a motor disposed inside the transferring robot 8, the lower arm 50 is rotated around the rotation center of the transferring robot 8 forming the axis thereof in the direction $Y_1$, and the rotating force of the motor is transmitted to the upper arm 51 to rotate the upper arm 51 around an axis 52 in the direction $Y_2$. Since the upper arm 51 and the lower arm 50 move in cooperation, the high temperature use arm 53 coupled to the upper arm 51 moves linearly in the direction Z, and is introduced into the processing chamber 3. Wafers 10 in the processing chamber 3, which are held on respective wafer holders 6 and for which ion injection has been completed, are separated from the respective wafer holders by means of a pick-up pin which will be explained later, and the high temperature use arm 53 introduced into the processing chamber 3 is inserted between the wafer holder 6 and the separated wafer 10 to receive the same thereon. Further, with another motor disposed in the transferring robot 8, the transferring robot 8 itself is rotated in the direction $Y_3$ to cause the high temperature use arm 53 to face toward a high temperature use cassette 54. Thereafter, the upper arm 51 and the lower arm 50 are rotated to extend the high temperature use arm 53, and the wafer 10 is accommodated within the high temperature use cassette 54. The high temperature use cassette 54 is made of a material having a heat resistance close to the wafer material, such as Si and $SiO_2$ which generates no impurities and heavy metals.

After inserting the wafer 10 into the high temperature use cassette 54, a wafer 10 to which the ion injection has not yet been performed is taken out from an accommodation cassette 55a with a low temperature use arm 56 and is carried into the processing chamber 3. The low temperature use arm 56 is coupled to the upper arm 51 integral with the higher temperature use arm 53 in a manner to permit rotation thereof at the opposite side from the high temperature use arm 53. Accordingly, the out and in movement of the wafer 10 by the low temperature use arm 56 is performed by the transferring robot 8 in the same manner as with the high temperature use arm 53, in that, the operation is performed by rotating the upper arm 51 and the lower arm 50 to extend and contract the low temperature use arm 56 and further, by rotating the transferring robot 8 itself.

After completing a carrying in operation of seventeen new wafers 10 into the processing chamber 3, a sealing off valve 57 provided between the processing chamber 3 and the preparation chamber 7 is closed, the inside of the preparation chamber 7 is gas-purged with an inert gas, such as $N_2$ gas, and the seventeen wafers 10 for which ion injection processing has been completed and which have been accommodated in the high temperature use cassette 54 are cooled there. Further, during the cooling operation, the subsequent ion injection operation is performed at the same time in the processing chamber 3, whereby the entire processing time is shortened.

The wafers 10 within the high temperature use cassette 54, for which the cooling operation has been completed, are carried out using the low temperature use arm 56 and are inserted into the vacant accommodation cassette 54a. Three accommodation cassettes 55a, 55b and 55c are placed on a turn table 58, and through rotation of the turn table 58 the accommodation cassettes 55a, 55b and 55c are successively in a position facing the low temperature arm 56 as well as a take out port 59 provided at the side wall of the preparation chamber 7. One of the accommodation cassettes 55a, 55b and 55c accommodating wafers 10, for which the ion injection processing has been completed, is taken out to the outside through the take out port 59 and another accommodation cassette accommodating a non-processed wafer 10 is carried into the preparation chamber 7 through the port 59.

According to the present embodiment, since the high temperature use arm 53 is made of a heat resistant material, such as ceramic, when the wafers 10, for which ion injection has been completed, are transferred from the wafer holder 6, serving as a wafer holding portion, to the high temperature use cassette 54, splashing of impurities and heavy metals from the high temperature use arm 53 itself is prevented.

Further, with the provision of two kinds of cassettes, that is, the accommodation cassettes 55 and the heat resistant high temperature use cassette 54, the wafers 10 for which the ion injection has been completed are first accommodated in the high temperature use cassette 54 and are cooled there, such that the accommodation cassettes 55 are not required to have a heat resistant property, and it is only required to prepare a single heat resistant high temperature use cassette 54, which contributes to a cost reduction of the device. Generally, the accommodation cassettes 55 are also used in the processes before and after the ion injection process, and so it is required to provide many of such accommodation cassettes; however, it is sufficient if a single heat resistant high temperature use cassette 54 is provided, and conventional cassettes having no heat resistant property can be used for the accommodation cassettes 55 as they are.

Further, when cooling the high temperature wafers 10 after completion of the ion injection and after they have been accommodated in the high temperature use cassette 54, if the inside of the preparation chamber 7 is kept in a vacuum condition, the heat which escapes therefrom is limited; therefore, the processing chamber 3 in which the ion injection is performed is separated from the preparation chamber 7 in which the high temperature use cassette 54 is disposed via the sealing off valve 57, and the preparation chamber 7 is gas-purged with an inert gas, whereby the cooling time is shortened.

Further, by providing separation between the processing chamber 3 in which the ion injection is performed and the preparation chamber 7 in which the wafers 10 after completion of the ion injection are cooled via the sealing off valve 57, the respective processings are independently performed in the respective chambers, whereby the entire time for the processings is shortened.

Now, an attachment and detachment mechanism for a wafer 10 which is held on the wafer holder 6 will be explained with reference to FIG. 14.

Figure 14:
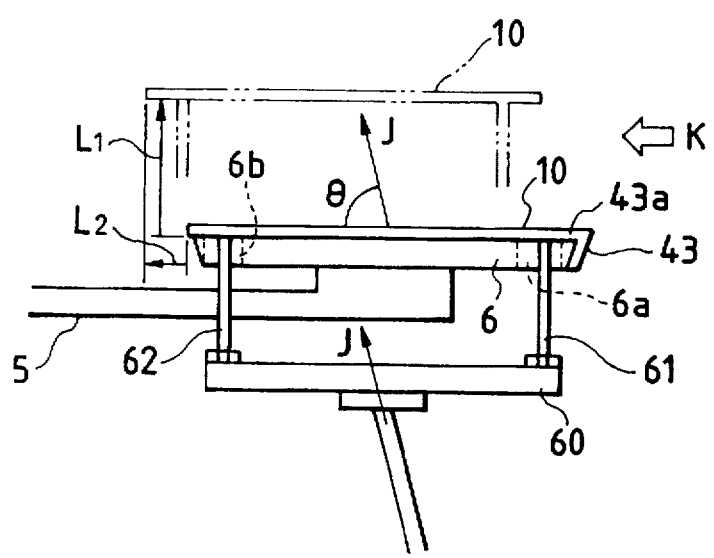
FIG. 14 is a side view showing a wafer attaching and detaching mechanism employed in the ion injection device according to the present invention.

As illustrated in FIG. 14, the attachment and detachment mechanism is structured to support the wafer 10 held on the wafer holder 6, which is secured to the rotatable disk 5, from the bottom face of the wafer 10. Namely, in the wafer holder 6, slits 6a and 6b and two other slits (not shown) are formed. To the wafer pick-up 60, pick-up pins 61 and 62 and two other pickup pins (not shown) are secured. When the pick-up pins, such as pins 61 and 62, are raised from beneath the wafer holder 6 so as to pass through the slits, such as slits 6a and 6b, while the pins are in contact with the bottom face of the wafer 10, the wafer 10 is elevated. In this case, since the edge face of the wafer 10 is in contact with the seat 43 secured to the wafer holder 6 at the contacting face 43a, if the wafer 10 is elevated straight upward, the edge face of the wafer 10 rubs against the seat 43; therefore, in order to avoid such rubbing, the wafer pick-up 60 is raised in the direction J as opposed to raising the same straight upward. The raising angle $\theta$ in this case is about 87°. The raising distance $L_1$ of the wafer pick-up 60 is 3 cm and the horizontal displacement $L_2$ in this instance is about 1 mm. Accordingly, the slits, such as slits 6a and 6b, are formed to have a diameter larger than the outer diameter of the pick-up pins, such as by 2–3 mm. Further, in relation to FIG. 13, the high temperature use arm 53 is introduced from the preparation chamber 7 in the direction of an arrow Z and is inserted between the wafer 10 and the wafer holder 6 after the wafer 10 has been elevated. After thus inserting the high temperature use arm 53, the wafer pick-up 60 is lowered, thereby the wafer 10 is placed on the high temperature use arm 53.

Further, when placing a new wafer 10 on the wafer holder 6, the new wafer 10 is placed in a like manner on the wafer holder 6 without rubbing the edge end of the wafer 10 against the contacting face 43a of the seat 43.

According to the present embodiment, when removing the wafer 10 from the wafer holder 6, the edge face of the wafer 10 is prevented from being rubbed against the wafer holder 6, so that no flaws are produced in the wafer 10 and splashing of powder caused by the wafer 10 in the processing chamber 7 is prevented.

Now, another feature of the operation of the rotatable disk arrangement in the ion injection device according to the present invention will be explained with reference to FIG. 15.

Figure 15:
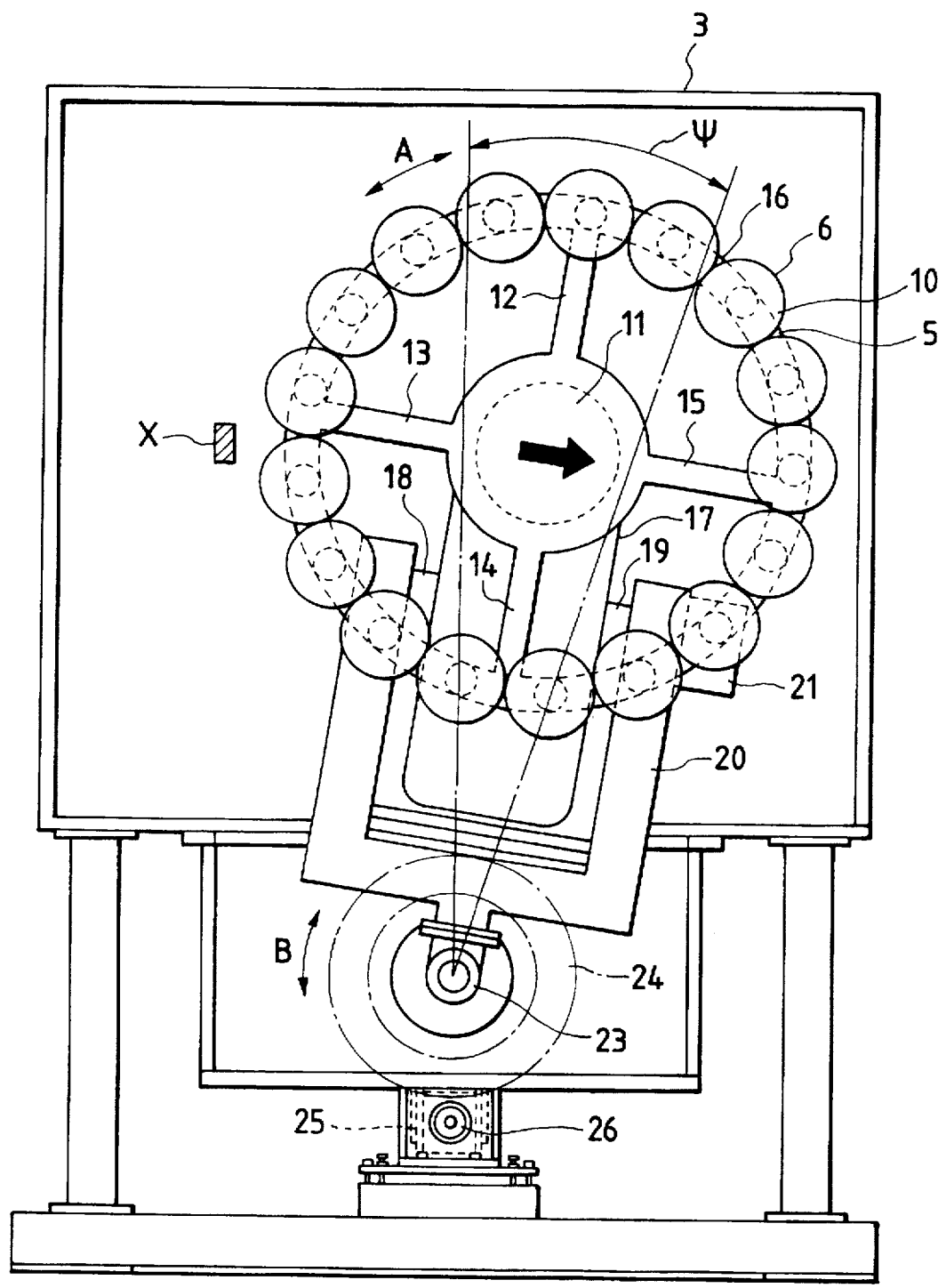
FIG. 15 is a front view showing another feature of the rotatable disk device employed in the ion injection device of the embodiment according to the present invention.

In FIG. 15, wafer holders 6 on which respective wafers 10 are loaded are disposed along the circumference of the rotatable disk 5, and the rotatable disk 5 is designed to rock around the scanning axis 23, thereby the surface of the respective wafers 10 moves across the ion beam X so that ion injection is performed. In the ion injection operation, the ion beam X at the initial ion emitting period contains many types of particles, and, for this reason, if the ion beam X at this initial period is irradiated onto the wafer 10, many types of particles are deposited on the wafer 10. Therefore, at the initial ion emitting period, the rotatable disk 5 is moved to the position shown in the drawing in which the ion beam X never hits the surface of the wafer 10.

According to this feature, the particle deposition on the wafer 10 is prevented during the initial ion emitting period.

Figure 16:
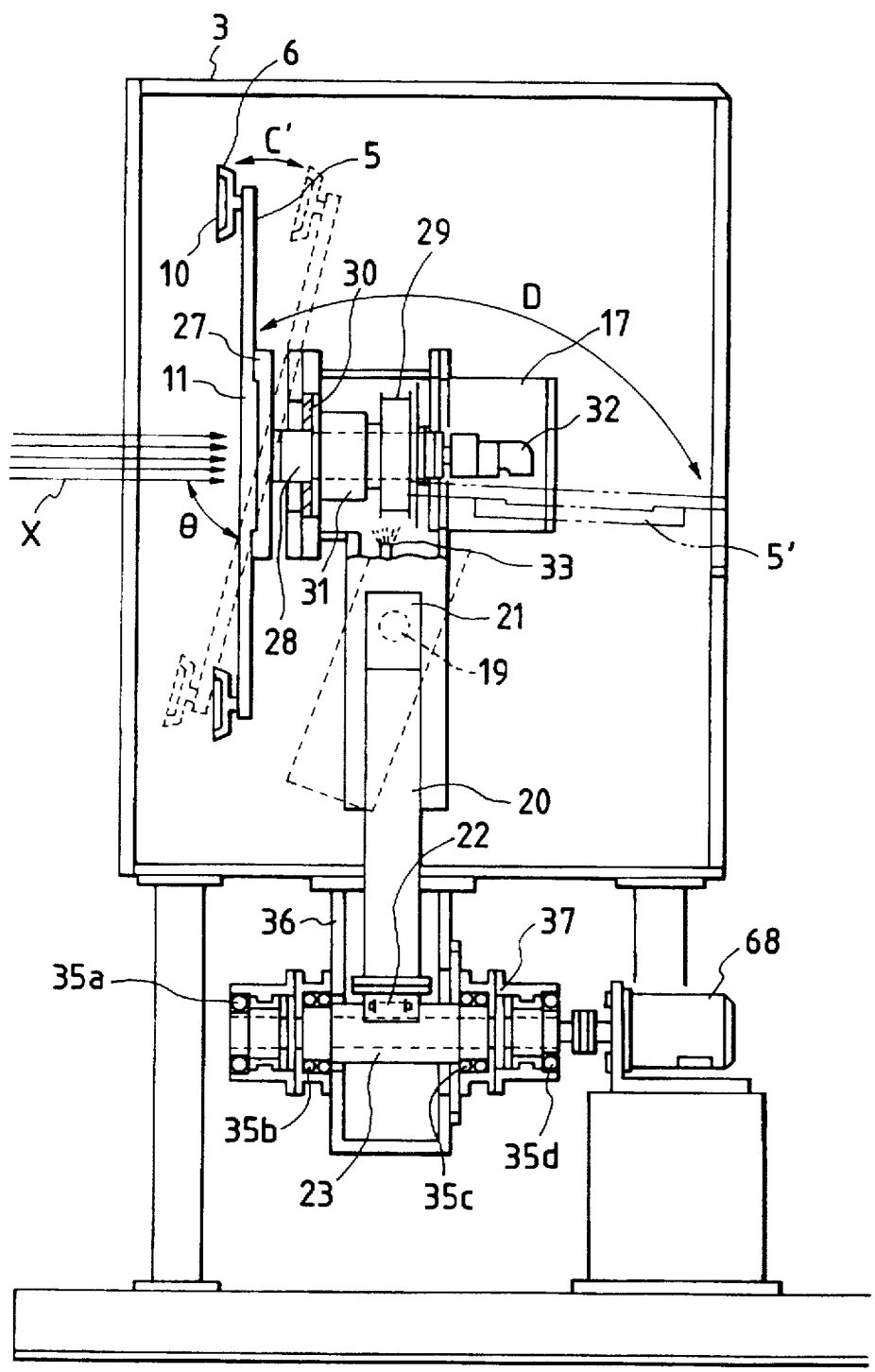
FIG. 16 is a side view showing a variation of the embodiment of the ion injection device according to the present invention.

FIG. 16 shows still another embodiment for rocking the rotatable disk 5 in the ion injection device according to the present invention. In the FIG. 16 embodiment, the wafer holders 6, on which respective wafers 10 are loaded, are disposed along the circumference of the rotatable disk 5, the rotatable disk 5 is held on the inner chamber 17 via the shaft 28, the inner chamber 17 is supported by the U shaped shaft 20 which is secured to the scanning axis 23 and through the normal and reverse rotation of the scanning axis 23 the rotatable disk 5 performs the rocking motion.

In the present embodiment, the scanning axis 23 is directly coupled to a motor 68 for rotating the same. With such a structure, any deviation and play caused when the transmission and driving system are connected by gears are eliminated, whereby a highly accurate rocking motion can be obtained.

In the ion injection device according to the present invention, as explained hitherto, with the provision of the wafer holding means for holding a wafer, the relative position varying means for varying the relative position between the wafer holding means and the ion beam within a plane substantially perpendicular to the direction of the ion beam, and the incidence angle varying means for varying an incidence angle of the ion beam on the surface of the wafer held on the wafer holding means, the influence of channelling is prevented and ion injection with an optimum angle can be realized.

Further, in the method of ion injection according to the present invention, as explained hitherto, with the steps of taking out oxygen ions from the ion source and of implanting the oxygen ions into the wafer while varying the incidence angle of the ion beam on the surface of the wafer, the oxygen ions are implanted into the wafer with an optimum angle and an optimum $SiO_2$ layer is formed by making use of the SIMOX.

We claim:

1. An ion injection device comprising:
   wafer holding means for holding a wafer into which ions from an ion beam produced from an ion source is implanted;
   relative position varying means for varying the relative position between said wafer holding means and the ion beam within a plane substantially perpendicular to the direction of the ion beam; and
   incidence angle varying means for varying the angle of incidence of the ion beam on the surface of a wafer held on said wafer holding means;
   wherein said wafer holding means is a rotatable disk which holds a plurality of wafers on a circumference thereof and said relative position varying means includes rotating means which causes said rotatable disk to rotate in a plane substantially perpendicular to the direction of the ion beam and rocking means for rocking said rotatable disk in a plane substantially perpendicular to the direction of the ion beam.

2. An ion injection device according to claim 1, further comprising control means for controlling at least one of the rotating speed of said rotating means and the rocking speed of said rocking means in such a manner that the moving speed v of the wafers determined when a wafer moves across the ion beam due to the rocking motion of said rotatable disk produced by said rocking means is inversely proportional to the rotating speed w of the wafer determined when the wafer moves across the ion beam due to the rotating motion of said rotatable disk produced by said rotating means.

3. An ion injection device according to claim 1, wherein the rocking axis of said rocking means is coupled directly with a driving source therefor.

4. An ion injection device according to claim 1, wherein the ion injection device further comprises heating means disposed at a position opposing the wafer held on said rotatable disk.

5. An ion injection device according to claim 4, further comprising temperature measuring means for measuring the temperature of the wafer held on said rotatable disk and signal generating means for generating a reference trigger signal in synchronism with the rotation of said rotatable disk.

6. An ion injection device according to claim 5, wherein said temperature measuring means measures the temperature of the wafer at the timing of the reference trigger signal outputted from said signal generating means.

7. An ion injection device comprising:
   wafer holding means for holding a wafer into which ions from an ion beam produced from an ion source is implanted;
   relative position varying means for varying the relative position between said wafer holding means and the ion beam within a plane substantially perpendicular to the direction of the ion beam; and
   incidence angle varying means for varying the angle of incidence of the ion beam on the surface of a wafer held on said wafer holding means;
   wherein said wafer holding means is a rotatable disk which holds a plurality of wafers on the circumference thereof and said relative position varying means includes rotating means which causes said rotatable disk to rotate in a plane substantially perpendicular to the direction of the ion beam and rocking means for rocking said rotatable disk in a plane substantially perpendicular to the direction of the ion beam, and wherein the ion injection device further comprises heating means disposed at a position opposing the wafer held on said rotatable disk.

8. An ion injection device comprising:
   wafer holding means for holding a wafer into which ions from an ion beam produced from an ion source is implanted;
   relative position varying means for varying the relative position between said wafer holding means and the ion beam within a plane substantially perpendicular to the direction of the ion beam; and
   incidence angle varying means for varying the angle of incidence of the ion beam on the surface of a wafer held on said wafer holding means;
   wherein said wafer holding means is a rotatable disk which holds a plurality of wafers on the circumference thereof and said relative position varying means includes rotating means which causes said rotatable disk to rotate in a plane substantially perpendicular to the direction of the ion beam and rocking means for rocking said rotatable disk in a plane substantially perpendicular to the direction of the ion beam, and wherein the ion injection device further comprises heating means disposed at a position opposing the wafer held on said rotatable disk, temperature measuring means for measuring the temperature of the wafer held on said rotatable disk and signal generating means for generating a reference trigger signal in synchronism with the rotation of said rotatable disk, wherein said temperature measuring means measures the temperature of the wafer at the timing of the reference trigger signal outputted from said signal generating means.

9. An ion injection device comprising:

wafer holding means for holding a wafer into which ions from an ion beam produced from an ion source is implanted;

relative position varying means for varying the relative position between said wafer holding means and the ion beam within a plane substantially perpendicular to the direction of the ion beam;

incidence angle varying means for varying the angle of incidence of the ion beam on the surface of a wafer held on said wafer holding means; and a wafer pick-up which operates to insert a pin from the bottom portion of said wafer holding means through an opening provided in the wafer holding means after said wafer holding means is placed in a horizontal position, so as to separate a wafer held on the wafer holding means from said wafer holding means, the angle of the moving direction of said wafer pick-up with respect to the surface of the wafer being set below 90°.

10. An ion injection device comprising:

wafer holding means for holding a wafer into which ions from an ion beam produced from an ion source is implanted;

relative position varying means for varying the relative position between said wafer holding means and the ion beam within a plane substantially perpendicular to the direction of the ion beam; and incidence angle varying means for varying the angle of incidence of the ion beam on the surface of a wafer held on the wafer holding means; and wherein said wafer holding means is a rotatable disk which holds a plurality of wafers on the circumference thereof and said relative position varying means includes rotating means which causes said rotatable disk to rotate in a plane substantially perpendicular to the direction of the ion beam and rocking means for rocking said rotatable disk in a plane substantially perpendicular to the direction of the ion beam; and further comprising:

an accommodating cassette for accommodating a wafer before and after said wafer is subjected to ion injection processing;

a high temperature use cassette constituted by a heat resistant material for accommodating a wafer immediately after ion injection processing; and a transferring means for transferring a wafer mutually between said accommodating cassette, said high temperature use cassette and said wafer holding means, said transferring means being provided with a high temperature use arm made of a heat resistant material which detaches the wafer immediately after ion injection processing from said wafer holding means, and transfers and accommodates the same in said high temperature use cassette and a low temperature use arm which transfers the wafer before ion injection processing from said accommodating cassette to said wafer holding means and transfers the wafer from said high temperature use cassette to said accommodating cassette after ion injection processing.

11. An ion injection device according to claim 10, further comprising a preparation chamber containing said accommodating cassette, said high temperature use cassette and said transferring means therein; a processing chamber containing said wafer holding means, said relative position varying means and said incidence angle varying means therein; and a sealing off valve which separates said preparation chamber from said processing chamber in an air tight manner, so that after a wafer which has been subjected to ion injection processing is accommodated in said high temperature use cassette and a wafer yet to be subjected to ion injection processing is held on said wafer holding means, said preparation chamber and said processing chamber can be separated in an air tight manner and said preparation chamber can be gas-purged.

12. A method of ion injection using an ion beam produced from an ion source to implant ions into a wafer, comprising the steps of:

implanting oxygen ions taken out from the ion source into the wafer, while varying the incidence angle of the ion beam on the surface of the wafer;

wherein a plurality of the wafers are held along a circumference, and further comprising the steps of:

rotating the wafers along said circumference in a plane substantially perpendicular to the direction of the ion beam, as well as rocking the wafers a plane substantially perpendicular to the direction of the ion beam.

13. A method of ion injection according to claim 12, wherein at least one of the rotating speed and the rocking speed is controlled in such a manner that the moving speed v of the wafers determined when a wafer moves across the ion beam due to the rocking motion is inversely proportional to rotating speed w of the wafer determined when the wafer moves across the ion beam due to the rotating motion.

14. A method of ion injection according to claim 12, wherein at least one of the rotating speed and the rocking speed is controlled in such a manner that the moving speed v of the wafers determined when a wafer moves across the ion beam due to the rocking motion is inversely proportional to rotating speed w of the wafer determined when the wafer moves across the ion beam due to the rotating motion.

* * * * *